(12) United States Patent
Nagai et al.

(10) Patent No.: US 9,578,743 B2
(45) Date of Patent: Feb. 21, 2017

(54) CIRCUIT BOARD

(71) Applicant: NGK SPARK PLUG CO., LTD., Nagoya-shi, Aichi (JP)

(72) Inventors: Makoto Nagai, Komaki (JP); Seiji Mori, Kounan (JP); Tatsuya Ito, Kakamigahara (JP)

(73) Assignee: NGK SPARK PLUG CO., LTD., Nagoya (JP)

( * ) Notice: Subject to any disclaimer, the term of this patent is extended or adjusted under 35 U.S.C. 154(b) by 5 days.

(21) Appl. No.: 14/858,409

(22) Filed: Sep. 18, 2015

(65) Prior Publication Data

US 2016/0095216 A1 Mar. 31, 2016

(30) Foreign Application Priority Data

Sep. 29, 2014 (JP) ................... 2014-199366

(51) Int. Cl.
  *H05K 1/00* (2006.01)
  *H05K 1/11* (2006.01)
  *H05K 1/02* (2006.01)
  *H05K 1/03* (2006.01)

(52) U.S. Cl.
  CPC ............. *H05K 1/11* (2013.01); *H05K 1/0298* (2013.01); *H05K 1/0313* (2013.01)

(58) Field of Classification Search
  CPC ... H05K 1/02; H05K 1/09; H05K 1/11; H05K 1/18; H05K 3/10; H01L 21/58; H01L 21/60; H01L 23/49
  USPC ........ 174/250, 257, 260, 261, 266; 438/107, 438/125; 361/763
  See application file for complete search history.

(56) References Cited

U.S. PATENT DOCUMENTS

| | | | |
|---|---|---|---|
| 2010/0175917 A1* | 7/2010 | Miyasaka et al. | 174/266 |
| 2010/0330742 A1* | 12/2010 | Sugiyama et al. | 438/107 |
| 2011/0220404 A1* | 9/2011 | Yamasaki et al. | 174/261 |
| 2012/0083073 A1* | 4/2012 | Tanuma et al. | 438/125 |

(Continued)

FOREIGN PATENT DOCUMENTS

| | | |
|---|---|---|
| JP | 2011-14644 | 1/2011 |
| JP | 2013-149948 A | 8/2013 |

(Continued)

OTHER PUBLICATIONS

Taiwan Intellectual Patent Office, Office Action issued in corresponding Application No. 104131582, mailed Dec. 16, 2016.

*Primary Examiner* — Xiaoliang Chen
(74) *Attorney, Agent, or Firm* — Stites & Harbison, PLLC; Jeffrey A. Haeberlin; James R. Hayne

(57) ABSTRACT

A circuit board is provided that includes an outermost conductor layer including a plurality of terminals for flip-chip bonding and an outermost resin insulating layer defining a first opening and a second opening in an electronic-component mounting region. One of a power supply terminal and a ground terminal is exposed in the first opening. A plurality of signal terminals are exposed in the second opening. The resin insulating layer includes a reinforcing portion that defines an inner bottom surface of the second opening. A height of a portion of the terminal exposed in the first opening, the portion projecting from an inner bottom surface of the first opening, is greater than a height of portions of the terminals exposed in the second opening, the portions projecting from the inner bottom surface of the second opening.

2 Claims, 7 Drawing Sheets

(56) References Cited

U.S. PATENT DOCUMENTS

2013/0180772 A1    7/2013  Inoue et al.
2015/0008020 A1*  1/2015  Kaneko et al. ............... 174/257
2015/0016079 A1*  1/2015  Furutani et al. .............. 361/763
2015/0027750 A1    1/2015  Nishida et al.
2015/0216059 A1    7/2015  Hayashi et al.

FOREIGN PATENT DOCUMENTS

JP        2013-239603     11/2013
JP        2014-093512 A   5/2014

\* cited by examiner

CIRCUIT BOARD

CROSS REFERENCE TO RELATED APPLICATIONS

The present application claims priority to Japanese Patent Application No. 2014-199366, which was filed on Sep. 29, 2014, the disclosure of which is herein incorporated by reference in its entirety.

BACKGROUND OF THE INVENTION

Field of the Invention

The present invention relates to a circuit board including a plurality of terminals to which an electronic component, such as an integrated circuit (IC) chip, is connected by flip-chip bonding.

Description of the Related Art

Semiconductor integrated circuit devices (IC chips) used as microprocessors of computers or the like generally include many external connection terminals on the bottom surface thereof. In particular, IC chips having many signal terminals arranged along the outer periphery of the bottom surface thereof are called peripheral-type IC chips. Terminals to which the terminals on the IC chips are to be connected by flip-chip bonding are provided on a principal surface of a circuit board on which the IC chips are to be mounted. In recent years, with the increase in the terminal density of the IC chips, the number of terminals on the circuit board has been increased and the terminal pitch has been reduced.

Japanese Unexamined Patent Application Publication No. 2011-14644 discloses an example of a circuit board to which a peripheral-type IC chip can be connected by flip-chip bonding. This circuit board has a chip mounting region on a principal surface thereof, the chip mounting region having a rectangular shape that corresponds to the external shape of the IC chip. A plurality of signal terminals are arranged along the outer periphery of the chip mounting region. The signal terminals are provided on portions of band-shaped wiring conductors. The wiring conductors are covered with a solder resist layer that is provided on the principal surface of the board as an outermost resin insulating layer, so that most part of each wiring conductor is not exposed. The signal terminals are exposed at the same opening formed in the solder resist layer. In other words, the signal terminals have a non-solder mask defined (NSMD) structure. The exposed terminals and terminals on the IC chip (for example, terminals having a copper pillar structure) are arranged so as to face each other, and are electrically connected to each other with solder bumps or the like provided therebetween.

If the pitch of the signal terminals arranged in the same opening formed in the solder resist layer is small, there is a risk that solder will flow between the adjacent terminals and the terminals will be short-circuited. In addition, when only the lower surfaces of the fine signal terminals are bonded to the underlying resin insulating layer, there is a risk that the bonding strength will be insufficient. Accordingly, Japanese Unexamined Patent Application Publication No. 2013-239603, for example, proposes a structure in which insulating reinforcing portions are provided between the signal terminals in the opening. This circuit board is structured such that the lower surfaces and portions of side surfaces of signal terminals are supported by reinforcing portions that define the inner bottom surface of the opening. With this structure, the risk of short-circuiting between the terminals is reduced and the bonding strength of the terminals is increased. In addition, formation of voids in an underfill that fills the space between the IC chip and the circuit board can be suppressed.

The above-described circuit boards according to the related art generally include power supply terminals and ground terminals arranged in a central area of the chip mounting region in addition to the signal terminals arranged at the outer periphery of the chip mounting region. If these terminals are all provided with the above-described reinforcing portions, the following problem occurs when the terminals on the circuit board are connected to the terminals on the IC chip by soldering. That is, the areas of portions of the surfaces of the power supply terminals and ground terminals, the portions being connected to the solder, are reduced, and the solder cannot reliably flow to the side surfaces of the terminals on the circuit board. Therefore, there is a risk that the connection areas between the solder and the power supply terminals and between the solder and the ground terminals will be insufficient and the efficiency of power supply to the IC chip will be reduced. As a result, there is a possibility that the IC chip cannot reach its full performance potential.

BRIEF SUMMARY OF THE INVENTION

The present invention has been made in light of the above-described problem, and an object of the present invention is to provide a circuit board with which the risk of short-circuiting between terminals arranged at a small pitch can be reduced and the efficiency of power supply to an electronic component connected to the circuit board by flip-chip bonding can be increased.

As means for solving the above-described problem (first means), the present invention provides a circuit board including a multilayer body including a plurality of resin insulating layers and a plurality of conductor layers that are alternately stacked, the conductor layers including an outermost conductor layer that includes a plurality of terminals for connecting an electronic component to the circuit board by flip-chip bonding, the resin insulating layers including an outermost resin insulating layer at which the terminals are exposed. The outermost resin insulating layer has an inner side adjacent to another one of the plurality of resin insulating layers. The terminals include a power supply terminal, a ground terminal, and a signal terminal. The outermost resin insulating layer has (defines) a first opening, in which a single terminal selected from the power supply terminal and the ground terminal is exposed, and a second opening, in which two or more of the terminals including at least the signal terminal are exposed, in an electronic-component mounting region. The outermost resin insulating layer further includes a reinforcing portion that has a height smaller than or equal to a height of the terminals exposed by the second opening, the reinforcing portion defining an inner bottom surface of the second opening (i.e., a second bottom surface exposed by the second opening) and covering side surfaces of the terminals exposed in the second opening. In other words, the outermost resin insulating layer defines a second opening that exposes a second bottom surface defined by the reinforcing portion, and the second opening also exposes two or more of the terminals including at least the signal terminal. An inner bottom surface of the first opening (i.e., a first bottom surface exposed by the first opening) is defined by a surface of the outermost resin insulating layer or a surface of the another one of the resin insulating layers that is on the inner side of the outermost resin insulating layer. In other words, the outermost resin insulating layer defines a first opening that exposes a first bottom surface defined by a surface of the outermost resin insulating layer or a surface of the another one of the resin insulating layers that is on the inner side of the outermost resin insulating layer, and the first opening also exposes a single terminal selected from the power supply terminal and the ground terminal with the terminal exposed by the first opening having a portion projecting from the first bottom surface. A height of the portion of the terminal exposed in the first opening, i.e., the portion projecting from the first bottom surface (inner bottom surface of the first opening), is greater than a height of portions of the terminals exposed in the second opening, i.e., the portions projecting from the second bottom surface (inner bottom surface of the second opening). In other words, a height of the portion of the terminal exposed by the first opening is greater than a difference between the height of the terminals exposed by the second opening and the height of the reinforcing portion.

According to the first means of the present invention, the height of the portion of the terminal exposed in the first opening (that is, the power supply terminal or the ground terminal), the portion projecting from the inner bottom surface of the first opening, is greater than the height of portions of the terminals exposed in the second opening, the portions projecting from the inner bottom surface of the second opening. Therefore, the area of an exposed portion of the power supply terminal or the ground terminal that is exposed in the first opening is greater than the area of an exposed portion of each of the terminals that are exposed in the second opening. Accordingly, the solder reliably flows along the side surfaces of the power supply terminal or the ground terminal. As a result, the connection area between the solder and the power supply terminal or between the solder and the ground terminal increases, and the efficiency of power supply to the electronic component connected to the circuit board by flip-chip bonding can be increased. In addition, the side surfaces of the terminals exposed in the second opening are covered with the reinforcing portion, and the area of the exposed portion of each of the terminals is smaller than that of the exposed portion of the power supply terminal or the ground terminal exposed in the first opening. Therefore, even when the terminals are arranged at a small pitch, the risk of short-circuiting between the terminals can be reduced.

Preferably, the terminal exposed by the first opening includes a lower surface that is in contact with the another one of the resin insulating layers on the inner side of the outermost resin insulating layer, and all surfaces of the terminal exposed by the first opening other than the lower surface (e.g., an upper surface and side surfaces of the terminal) are exposed by the first opening. In other words, among all surfaces of the terminal disposed in the first opening, surfaces other than a lower surface that is in contact with the resin insulating layer on the inner side of the outermost resin insulating layer are exposed in the first opening. With this structure, the entire upper and side surfaces of the terminal disposed in the first opening (that is, the power supply terminal or the ground terminal) are exposed. Therefore, the solder reliably flows over along the side surfaces of the terminal over the entire areas thereof, and the connection area between the solder and the power supply terminal or between the solder and the ground terminal further increases. As a result, the power supply efficiency can be reliably increased.

The circuit board according to the first means is a so-called organic circuit board including a multilayer body that includes a plurality of resin insulating layers and a plurality of conductor layers that are alternately stacked. The organic circuit board is advantageous in that the wiring density can be more easily increased compared to, for example, a ceramic circuit board.

The resin insulating layers included in the multilayer body may be made of a build-up material containing a thermosetting resin as the main component. More specifically, the material of the resin insulating layers may be a thermosetting resin such as an epoxy resin, a phenol resin, a urethane resin, a silicone resin, or a polyimide resin. Alternatively, the material may be a composite material of any of the above-mentioned resins and glass fiber (glass woven fabric or glass non-woven fabric) or organic fiber such as polyamide fiber, or a resin-resin composite material obtained by impregnating a fluororesin base material having a three-dimensional network structure, such as continuous porous PTFE, with a thermosetting resin such as an epoxy resin. The outermost resin insulating layer included in the multilayer body may be formed of, for example, a photosensitive resin insulating material, more specifically, a solder resist material.

The conductor layers included in the multilayer body may be made of various types of conductive metals, such as copper, a copper alloy, silver, gold, platinum, nickel, titanium, aluminum, and chromium. The conductor layers of the organic circuit board are preferably made of a material containing copper as the main component. The conductor layers may be formed by a known method, such as a subtractive method, a semi-additive method, or a full-additive method. More specifically, copper foil etching, electroless copper plating, or copper electroplating, for example, may be employed. The conductor layers may instead be formed by forming a thin film by sputtering, chemical vapor deposition (CVD), etc., and then etching the film or by printing a conductive paste or the like.

There is no particular limitation regarding the electronic component as long as the electronic component can be connected to the circuit board by flip-chip bonding. The electronic component may be, for example, a peripheral-type IC chip in which multiple connection terminals are arranged along the outer periphery of the bottom surface of the chip, or an area-type IC chip in which multiple connection terminals are arranged over the entire area of the bottom surface of the chip. Examples of IC chips include an IC chip used as a microprocessor of a computer, a dynamic random access memory (DRAM), and a static random access memory (SRAM). An electronic component other than an IC chip may be used as long as multiple terminals are provided on the bottom surface thereof.

Among the conductor layers, the outermost conductor layer includes a plurality of terminals to which the electronic component is connected by flip-chip bonding. The terminals include the power supply terminal, the ground terminal, and the signal terminal. The terminals are formed in a square shape, a rectangular shape, an elliptical shape, or a circular shape in plan view. In the case where the terminals have a rectangular shape, the terminals may be arranged such that long sides thereof are parallel to each other.

The outermost resin insulating layer has a plurality of openings (first opening and second opening), in which the terminals are exposed, in the electronic-component mounting region. A single terminal selected from the power supply terminal and the ground terminal is exposed in the first opening. Two or more of the terminals including the signal terminal are exposed in the second opening. The terminals disposed in the second opening may all be signal terminals. The number of terminals disposed in the second opening is not limited. For example, several to several tens of terminals may be disposed in the second opening. The first and second openings may be arranged at any locations in the electronic-component mounting region. For example, the second opening may be disposed in an outer peripheral area of the electronic-component mounting region, and the first opening may be disposed in a central area of the electronic-component mounting region.

The inner bottom surface of the second opening (i.e., a second bottom surface exposed by the second opening) is defined by the reinforcing portion that reinforces the terminals disposed in the second opening. The reinforcing portion partially or entirely covers the side surfaces of the terminals exposed in the second opening. The reinforcing portion is a portion of the outermost resin insulating layer, and is formed such that the height thereof is smaller than or equal to the height of the terminals disposed in the second opening.

The inner bottom surface of the first opening (i.e., a first bottom surface exposed by the first opening) may be defined by either a surface of the outermost resin insulating layer, or a surface of the resin insulating layer disposed on the inner side of the outermost resin insulating layer.

The upper surfaces of the terminals exposed at a surface of the multilayer body may be covered with a metal coating layer formed by an outermost surface treatment, such as plating or sputtering. For example, when the main conductive metal contained in the terminals is copper or a copper alloy, a metal coating layer made of a metal other than copper or the copper alloy (for example, a nickel layer, a chromium layer, a palladium layer, a gold layer, a tin layer, or a solder layer) may be formed by the outermost surface treatment.

The height of the terminal disposed in the first opening may be substantially equal to the height of the terminals disposed in the second opening. However, the height of the terminal disposed in the first opening may instead be greater than the height of the terminals disposed in the second opening and smaller than the height of the opening edge of the first opening. Here, "the height of a terminal" means the height of the main conductive metal portion of the terminal, and the thickness of the metal coating layer is not included. More specifically, "the height of a terminal" is the height from the surface of the resin insulating layer on the inner side of the outermost resin insulating layer to the top end of the main conductive metal portion of the terminal.

The height of a portion of the terminal exposed in the first opening, the portion projecting from the first bottom surface (i.e., the inner bottom surface of the first opening), is hereinafter referred to simply as "projection height of the terminal in the first opening ($h1$)". The height of portions of the terminals exposed in the second opening, the portions projecting from the second bottom surface (i.e., the inner bottom surface of the second opening), is hereinafter referred to simply as "projection height of the terminals in the second opening ($h2$)". According to the first means, the projection height of the terminal in the first opening is greater than the projection height of the terminals in the second opening ($h1>h2$). Therefore, the area of an exposed portion of the power supply terminal or the ground terminal disposed in the first opening is greater than the area of an exposed portion of each of the terminals disposed in the second opening. Accordingly, the solder reliably flows along side surfaces of the power supply terminal or the ground terminal.

When the thickness of a portion of the reinforcing portion that is in contact with the terminals is not uniform, that is, when the height of a portion of the inner bottom surface that is in contact with the terminals is not uniform, the above-described heights $h1$ and $h2$ are determined by using the height of the portion of the inner bottom surface that is in contact with the terminals at the innermost position as a reference.

BRIEF DESCRIPTION OF THE DRAWINGS

Illustrative aspects of the invention will be described in detail with reference to the following figures wherein.

DETAILED DESCRIPTION OF EXEMPLARY EMBODIMENTS OF THE INVENTION

An organic circuit board will be described in detail below with reference to FIGS. 1 to 14 as a circuit board according to an embodiment of the present invention.

Figure 1:
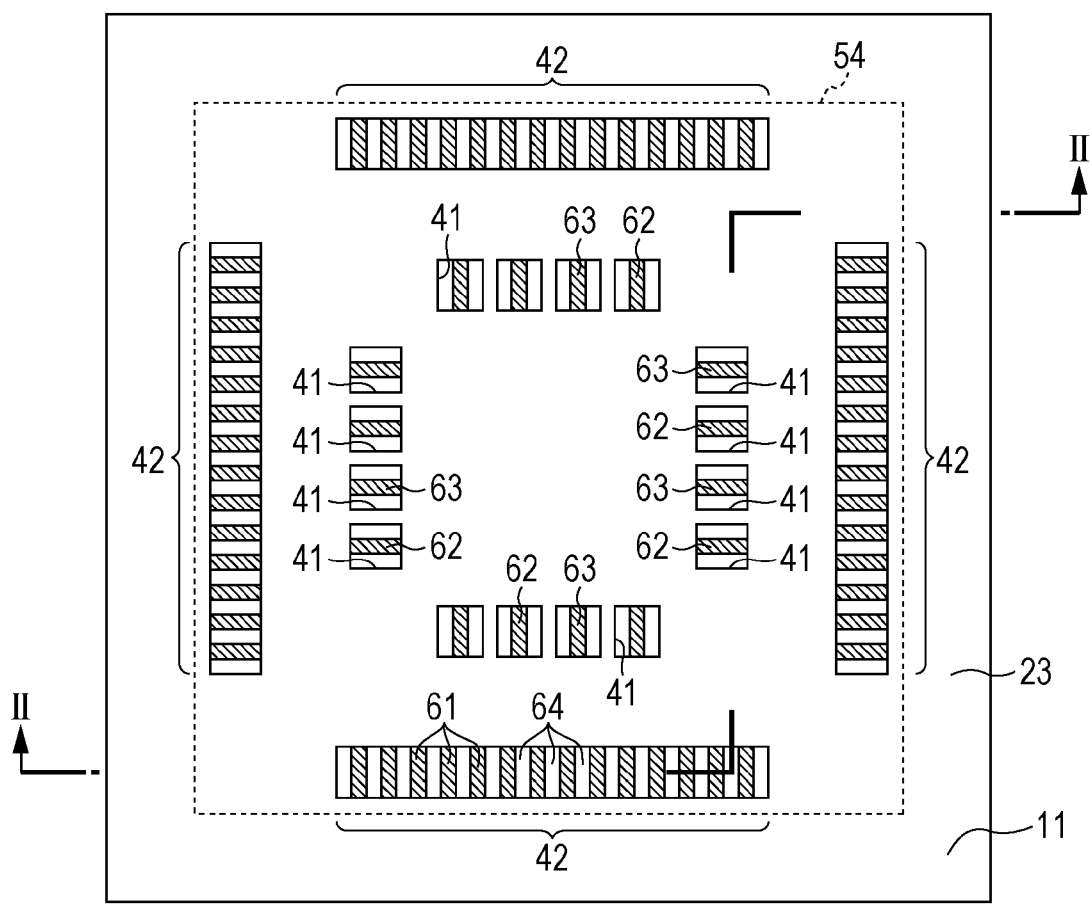
FIG. 1 is a schematic plan view of an organic circuit board according to an embodiment of the present invention.
Figure 2:
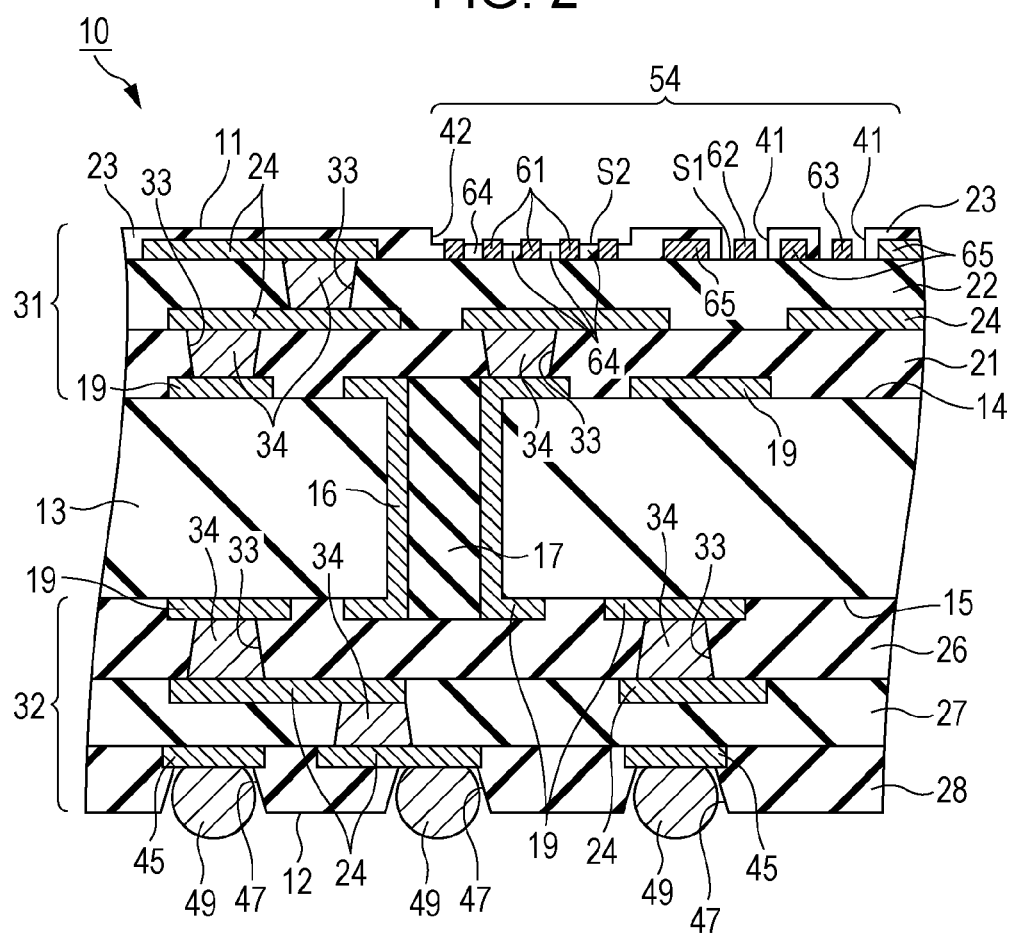
FIG. 2 is a schematic sectional view of the circuit board illustrated in FIG. 1 taken along line II-II.
Figure 3:
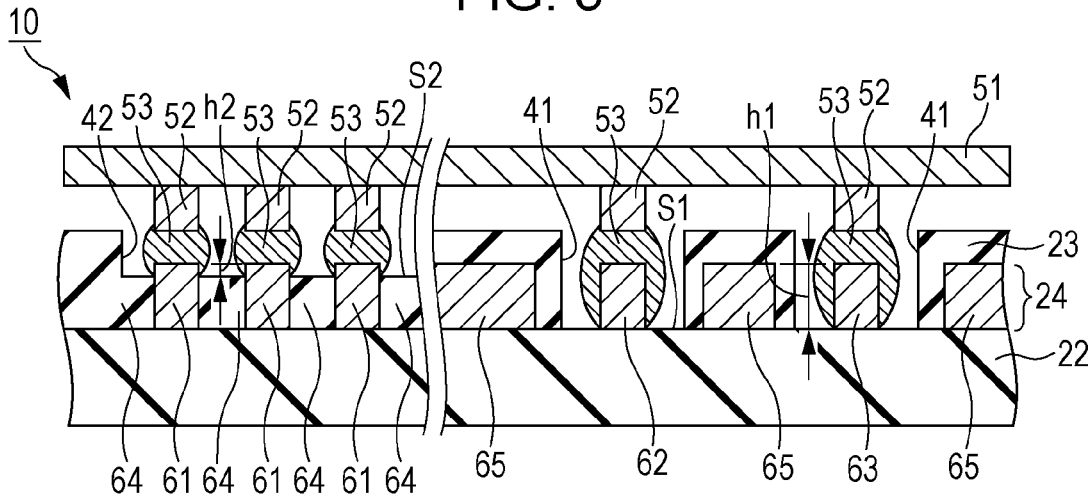
FIG. 3 is an enlarged sectional view of a main section of the circuit board to which an IC chip is connected by flip-chip bonding.
Figure 4:
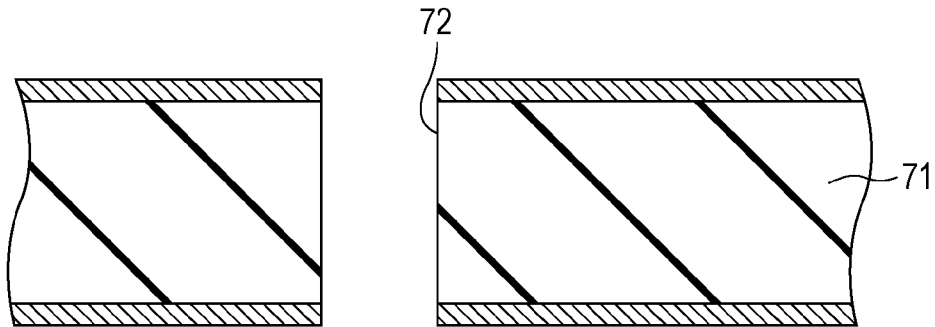
FIG. 4 is a schematic sectional view of a main portion of the circuit board, illustrating a state after holes are formed in a method for manufacturing the circuit board.

As illustrated in FIGS. 1 to 3, an organic circuit board 10 according to the present embodiment is a circuit board having a peripheral-type structure, and includes a board principal surface 11, which serves as an IC-chip mounting surface, and a board back surface 12 that opposes the principal surface 11. The organic circuit board 10 includes a rectangular plate-shaped core substrate 13, a first build-up layer 31 formed on a core principal surface 14 (upper surface in FIG. 2) of the core substrate 13, and a second build-up layer 32 formed on a core back surface 15 (lower surface in FIG. 2) of the core substrate 13.

The core substrate 13 according to the present embodiment is made of, for example, a resin insulating material (glass epoxy material) obtained by impregnating glass cloth, which serves as a reinforcing material, with an epoxy resin. The core substrate 13 has a plurality of through-hole conductors 16 that extend through the core principal surface 14 and the core back surface 15. The inner spaces of the through-hole conductors 16 are filled with filling members 17 made of, for example, an epoxy resin. Patterned conductor layers 19 made of copper are formed on the core principal surface 14 and the core back surface 15 of the core substrate 13. The conductor layers 19 are electrically connected to the through-hole conductors 16.

The first build-up layer 31 formed on the core principal surface 14 of the core substrate 13 is a multilayer body having a structure in which a plurality of resin insulating layers 21, 22, and 23 made of a thermosetting resin (epoxy resin) and a plurality of conductor layers 24 made of copper are stacked. The resin insulating layers 21 and 22 are made of a thermosetting resin insulating material (for example, an epoxy resin). The outermost conductor layer 24 of the first build-up layer 31 includes a plurality of terminals to which an IC chip 51, which serves as an electronic component, is to be connected by flip-chip bonding. These terminals include signal terminals 61, power supply terminals 62, and ground terminals 63, and are disposed at predetermined locations in a chip mounting region (electronic-component mounting region) 54. In the present embodiment, the outermost resin insulating layer 23 of the first build-up layer 31 is a solder resist layer 23 made of a photosensitive resin insulating material. The terminals 61 to 63 are provided on the upper surface of the resin insulating layer 22 that is immediately below the solder resist layer 23 (i.e, the resin insulation layer 22 that is on the inner side of the outermost resin insulating layer 23). The resin insulating layers 21 and 22 have via holes 33 and filled via conductors 34 formed therein. Each of the via conductors 34 is electrically connected to the conductor layers 19 and 24 and the terminals 61 to 63.

Figure 14:
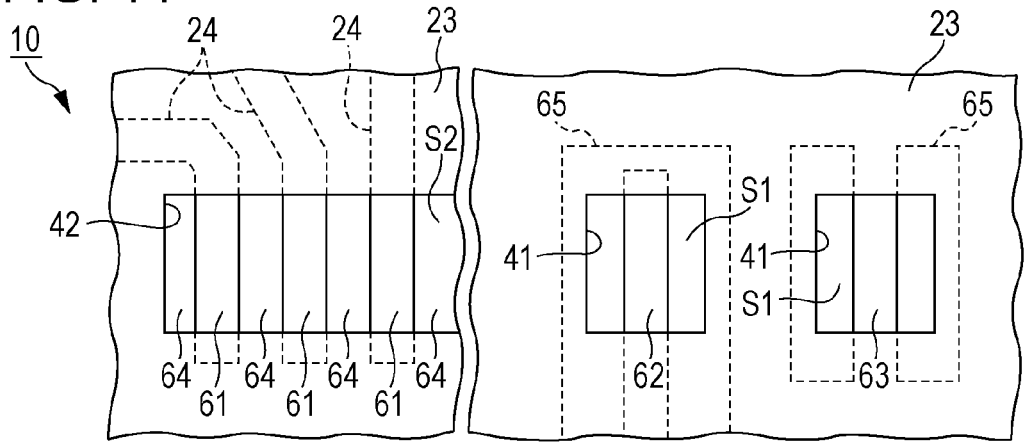
FIG. 14 is a schematic plan view of the main portion of the circuit board, illustrating the state after the second developing step of the method for manufacturing the circuit board.

As illustrated in, for example, FIGS. 1 and 14, the solder resist layer 23 has a chip mounting region 54 having a rectangular shape that corresponds to the external shape of the rectangular IC chip 51. Second openings 42 are formed at locations that are immediately inside the outer periphery of the chip mounting region 54. The second openings 42 have an elongated rectangular shape and extend along the sides of the chip mounting region 54. In addition, a plurality of rectangular first openings 41 are formed at locations closer to the center of the chip mounting region 54 than the second openings 42 are. Thus, in the present embodiment, the second openings 42 are arranged in an outer peripheral area of the chip mounting region 54, and the first openings 41 are arranged in a central area of the chip mounting region 54.

As illustrated in, for example, FIG. 14, a plurality of signal terminals 61, which are arranged at equal intervals, are exposed at each second opening 42. The signal terminals 61 have a rectangular shape in plan view, and are provided at the ends of wiring conductor portions of the outermost conductor layer 24. About half of the first openings 41 each have a single power supply terminal 62 exposed therein, and the remaining first openings 41 each have a single ground terminal 63 exposed therein. Therefore, the opening area of each of the first openings 41 is significantly smaller than that of each of the second openings 42. The distance between the terminals 62 and 63 disposed in two adjacent first openings 41 is greater than the distance between two adjacent signal terminals 61 in each second opening 42. A large-area conductor portion 65 is disposed immediately below the solder resist layer 23 so as to surround the first openings 41. The large-area conductor portion 65 is electrically connected to the ground terminals 63.

As illustrated in, for example, FIGS. 1 to 3 and 14, an inner bottom surface S2 of each second opening 42 (i.e., a second bottom surface exposed by the second opening 42) is defined by reinforcing portions 64. In the present embodiment, the reinforcing portions 64 are portions of the solder resist layer 23, and are formed such that the height thereof is slightly smaller than that of the signal terminals 61 arranged in the second opening 42. Each reinforcing portion 64 has a rectangular shape in plan view, and is disposed between the adjacent signal terminals 61. Major portions of the side surfaces of each signal terminal 61 are covered by the reinforcing portions 64. The reinforcing portions 64 are not provided in the first openings 41. Therefore, an inner bottom surface S1 of each first opening 41 (i.e., a first bottom surface exposed by the first opening 41) is defined by an exposed surface of the resin insulating layer 22 disposed on the inner side of the solder resist layer 23.

In FIG. 3, h1 represents the projection height of the power supply terminals 62 or the ground terminals 63 exposed in the first openings 41, and h2 represents the projection height of the signal terminals 61 exposed in the second openings 42. In the present embodiment, the projection height h1 of the terminals 62 or 63 in the first openings 41 is obviously greater than the projection height h2 of the terminals 61 in the second openings 42 (h1>h2). In the present embodiment, the terminals 61 to 63 have the same height. The projection height h1 is obtained by multiplying the height of the power supply terminals 62 or the ground terminals 63 by a factor of 1, and the projection height h2 is obtained by multiplying the height of the signal terminals 61 by a factor of about 0.1 to 0.3. In other words, among the surfaces of the power supply terminals 62 and the ground terminals 63, the surfaces other than the lower surfaces, which are in contact with the resin insulating layer 22 on the inner side, are exposed in the first openings 41. Thus, the power supply terminals 62 and the ground terminals 63 have an NSMD structure.

As illustrated in FIG. 3, the IC chip 51 mounted on the circuit board 10 of the present embodiment includes connection terminals 52 having, for example, a Cu pillar structure. Instead of the Cu pillar structure, the connection terminals 52 on the IC chip 51 that is connected to the circuit board 10 by flip-chip bonding may have an Au plated bump structure or an Au stud structure. The connection terminals 52 on the IC chip 51 are connected to the terminals 61 to 63 on the circuit board 10 by solder 53.

The second build-up layer 32 formed on the core back surface 15 of the core substrate 13 has substantially the same structure as that of the above-described first build-up layer 31. More specifically, the second build-up layer 32 has a multilayer structure in which resin insulating layers 26, 27, and 28 and conductor layers 24 are stacked. The outermost conductor layer 24 of the second build-up layer 32 includes a plurality of external connection terminals 45 to be connected to a motherboard (not shown). The resin insulating layers 26 and 27 also have via holes 33 and via conductors 34. Each via conductor 34 is electrically connected to the conductor layers 19 and 24 and the external connection terminals 45. The outermost resin insulating layer 28 of the second build-up layer 32 serves as a solder resist layer 28. The solder resist layer 28 has openings 47, in which the external connection terminals 45 are exposed, at predetermined positions. The lower surfaces of the external connection terminals 45 that are exposed in the openings 47 are covered with a plating layer (for example, a nickel-gold plating layer) that is not illustrated. A plurality of solder bumps 49, which are capable of being electrically connected to the motherboard (not shown), are arranged on the lower surfaces of the external connection terminals 45. The organic circuit board 10 is mounted on the motherboard (not shown) by using the solder bumps 49.

A method for manufacturing the organic circuit board 10 according to the present embodiment will be described with reference to FIGS. 4 to 14.

First, a copper clad laminate 71 including a base material made of a glass epoxy and copper foils bonded to both surfaces of the base material is prepared. Then, through holes 72 (see FIG. 4) that extend through the front and back surfaces of the copper clad laminate 71 are formed in the copper clad laminate 71 at predetermined positions by using a drilling machine. Then, the through-hole conductors 16 are formed in the through holes 72 by performing electroless copper plating and copper electroplating on the inner surfaces of the through holes 72 in the copper clad laminate 71.

Figure 5:
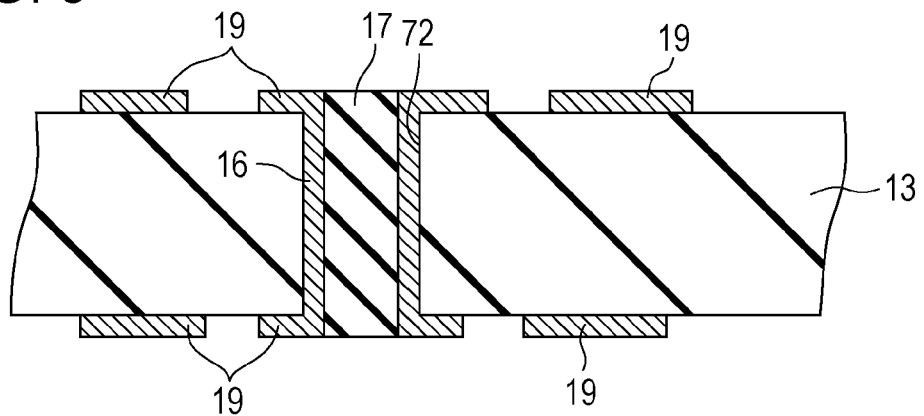
FIG. 5 is a schematic sectional view of the main portion of the circuit board, illustrating a state after through-hole conductors and conductor layers are formed in the method for manufacturing the circuit board.
Figure 6:
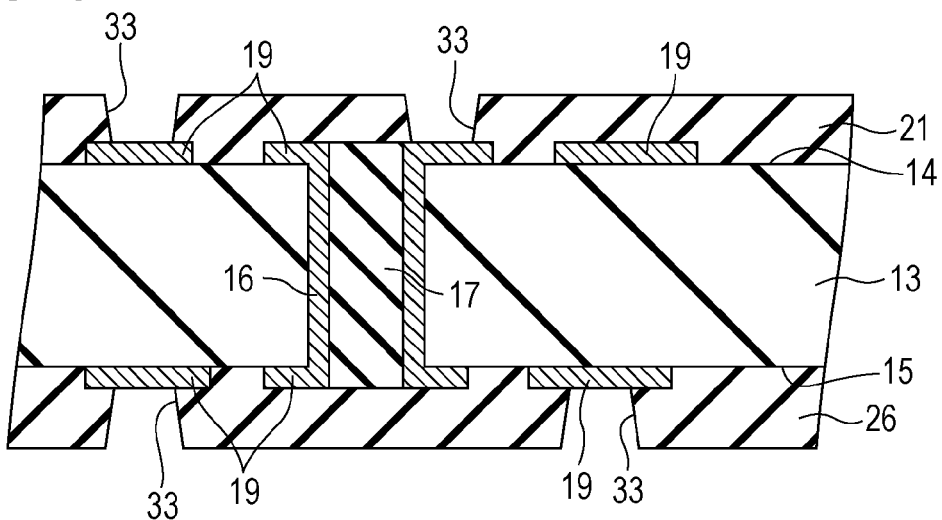
FIG. 6 is a schematic sectional view of the main portion of the circuit board, illustrating a state after via holes are formed in the method for manufacturing the circuit board.
Figure 7:
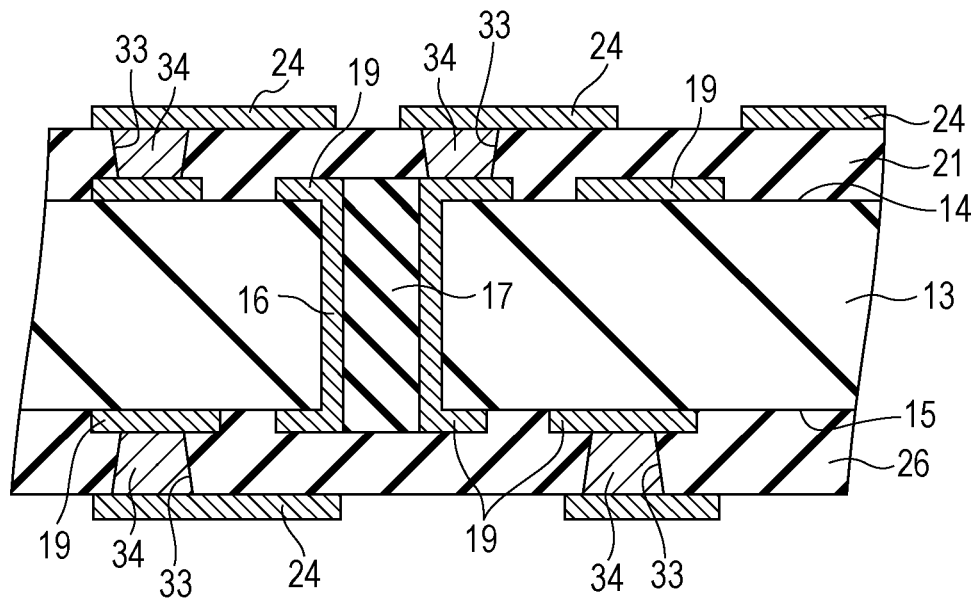
FIG. 7 is a schematic sectional view of the main portion of the circuit board, illustrating a state after an inner conductor layer is subjected to patterning in the method for manufacturing the circuit board.
Figure 8:
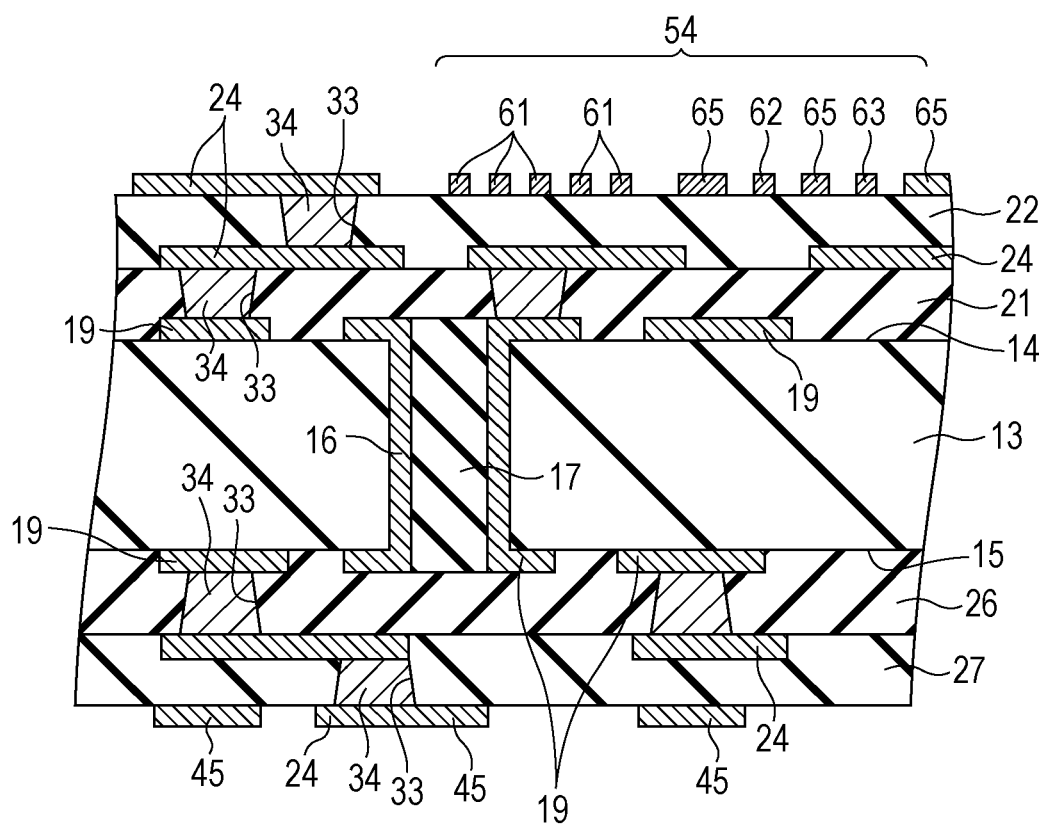
FIG. 8 is a schematic sectional view of the main portion of the circuit board, illustrating a state after an outermost conductor layer is subjected to patterning in the method for manufacturing the circuit board.
Figure 9:
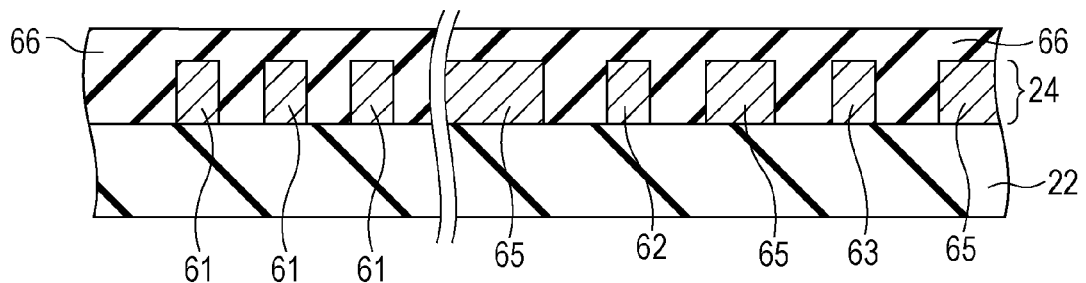
FIG. 9 is a schematic sectional view of the main portion of the circuit board, illustrating a state after a resin insulating material layer is formed in the method for manufacturing the circuit board.
Figure 10:
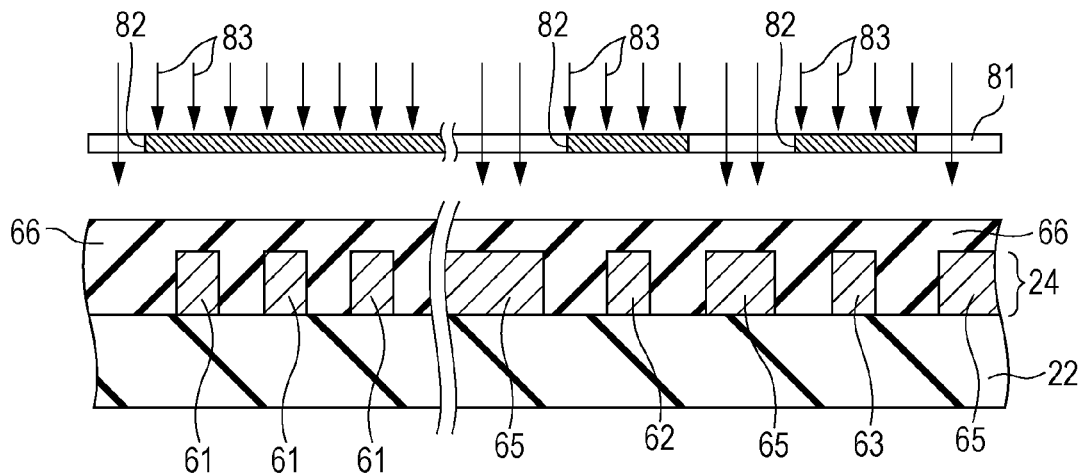
FIG. 10 is a schematic sectional view of the main portion of the circuit board, illustrating a first exposure step of the method for manufacturing the circuit board.

After that, the filling members 17 are formed by filling the hollow portions of the through-hole conductors 16 with an insulating resin material (epoxy resin) and curing the material. Then, the copper foils of the copper clad laminate 71 and the copper plating layers formed on the copper foils are subjected to patterning by, for example, a subtractive method. As a result, as illustrated in FIG. 5, the core substrate 13 on which the conductor layers 19 and the through-hole conductors 16 are formed is obtained.

Then, a build-up process is performed to form the first build-up layer 31 on the core principal surface 14 of the core substrate 13 and the second build-up layer 32 on the core back surface 15 of the core substrate 13.

More specifically, sheet-shaped resin insulating layers 21 and 26, which are made of an epoxy resin, are placed on and bonded to the core principal surface 14 and the core back surface 15, respectively, of the core substrate 13. Then, the via holes 33 are formed in the resin insulating layers 21 and 26 at predetermined positions (see FIG. 6) by using, for example, an excimer laser, an ultraviolet (UV) laser, or a $CO_2$ layer. Next, a desmearing process is performed to remove smear from the via holes 33 by using an etchant such as a potassium permanganate solution. Instead of using an etchant, the desmearing process may be performed by plasma asking using, for example, an $O_2$ plasma.

After the desmearing process, the via conductors 34 are formed in the via holes 33 by performing electroless copper plating and copper electroplating by a known method. Then, patterned conductor layers 24 are formed on the resin insulating layers 21 and 26 by performing etching by a known method, such as a semi-additive method (see FIG. 7).

The other resin insulating layers 22 and 27 and conductor layers 24 are stacked on the resin insulating layers 21 and 26 by a method similar to the above-described method for forming the resin insulating layers 21 and 26 and the conductor layers 24 on the resin insulating layers 21 and 26. Thus, the conductor layer 24 on the resin insulating layer 22 is formed (see FIG. 8). In addition, the conductor layer 24 including the external connection terminals 45 is formed on the resin insulating layer 27.

Next, a photosensitive resin insulating material, which is the material of the solder resist layer 23, is applied to the resin insulating layer 22. Thus, a resin insulating material layer 66 that covers the conductor layer 24, which includes the terminals 61 to 63, over the entire area thereof is formed (see FIG. 9). Here, a solder resist material containing a photosensitive epoxy resin as the main component, for example, is selected as the photosensitive resin insulating material. The solder resist material may be a liquid or a film that can be applied to the resin insulating layer 22. In the case where a film-shaped solder resist material is used, to ensure sufficient surface flatness, the applied solder resist material is preferably pressed in the thickness direction before exposure and development are performed.

Next, a first photomask 81, which is a glass substrate having light-transmitting portions 82 at predetermined positions, is placed above the resin insulating material layer 66. In this state, ultraviolet rays 83 are emitted through the first photomask 81 under common conditions, so that the resin insulating material layer 66 is partially exposed to the ultraviolet rays 83 (see FIG. 10). As a result of this first exposure process, portions of the resin insulating material layer 66 that are directly below the light-transmitting portions 82 of the first photomask 81 are irradiated with the ultraviolet rays 83, and the irradiated portions of the resin insulating material layer 66 selectively react to the light.

Figure 11:
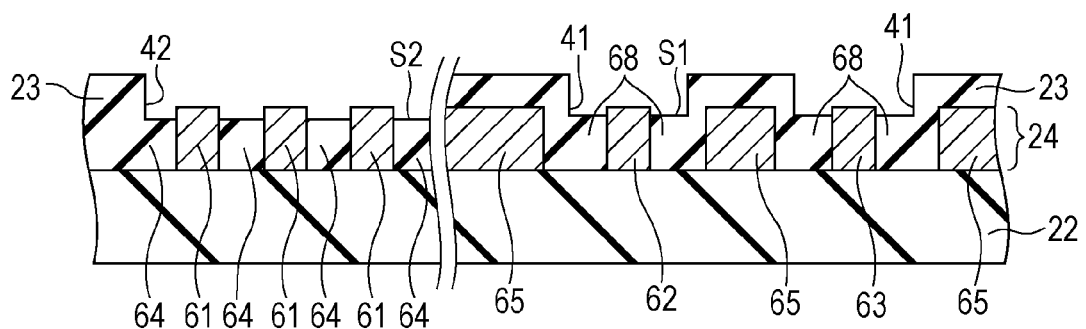
FIG. 11 is a schematic sectional view of the main portion of the circuit board, illustrating a state after a first developing step of the method for manufacturing the circuit board.
Figure 12:
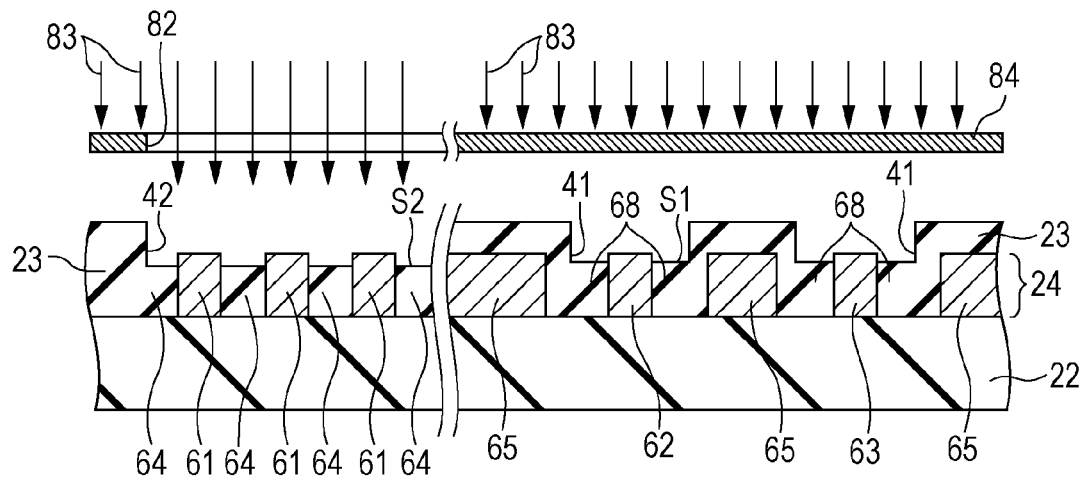
FIG. 12 is a schematic sectional view of the main portion of the circuit board, illustrating a second exposure step of the method for manufacturing the circuit board.
Figure 13:
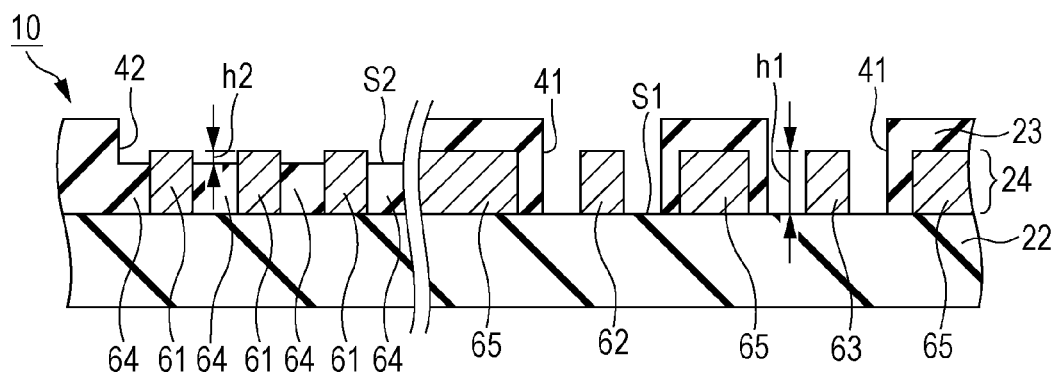
FIG. 13 is a schematic sectional view of the main portion of the circuit board, illustrating a state after a second developing step of the method for manufacturing the circuit board.

After that, the resin insulating material layer 66 is developed by using a dedicated developing solution so that the thickness of the unexposed portions is reduced to about 3 to 12 μm (see FIG. 11). As a result of this first developing process, the solder resist layer 23, which is the outermost resin insulating layer, is formed and the reinforcing portions 64, which are portions of the solder resist layer 23, are also formed. Thus, the second openings 42, which have the inner bottom surfaces S2 defined by the reinforcing portions 64, are formed in the solder resist layer 23. Note that in this step, the solder resist layer 23 is not yet completely cured. The inner bottom surfaces S1 of the first openings 41 are defined by resin portions 68 (portions of the solder resist layer 23) having the same height as that of the reinforcing portions 64.

Next, a second photomask 84, which is a glass substrate having light-transmitting portions 82 at predetermined positions (that is, positions corresponding to the positions of the second openings 42), is placed above the solder resist layer 23. In this state, the ultraviolet rays 83 are emitted through the second photomask 84 under common conditions, so that the solder resist layer 23 is partially exposed to the ultraviolet rays 83 (see FIG. 12). As a result of this second exposure process, portions of the solder resist layer 23 directly below the light-transmitting portions 82 of the second photomask 84 are irradiated with ultraviolet rays 83, and the irradiated portions of the solder resist layer 23 selectively react to the light.

After that, a second developing process is performed by using the above-described dedicated developing solution so that the resin portions 68 of the solder resist layer 23 are completely removed and the upper surface of the resin insulating layer 22 on the inner side of the solder resist layer 23 is exposed. Thus, the solder resist layer 23, which is the outermost resin insulating layer, is completed (see FIGS. 13 and 14). Then, the solder resist layer 23 is cured with heat or ultraviolet rays, and the surfaces of the terminals 61 to 63 are subjected to an outermost surface treatment, such as nickel-gold plating, as necessary. As a result of the above-described processes, the organic circuit board 10 in which the reinforcing portions 64 are provided in the second openings 42 but not provided in the first openings 41 is completed.

The following effects can be obtained by the present embodiment.

That is, as described above, in the organic circuit board 10 according to the present embodiment, the projection height h1 of the terminals 62 or 63 in the first openings 41 is obviously greater than the projection height h2 of the signal terminals 61 in the second openings 42 (h1>h2). Therefore, the area of exposed portions of the power supply terminals 62 or the ground terminals 63 is greater than that of the exposed portions of the signal terminals 61. Accordingly, when the IC chip 51 is connected to the circuit board 10 by flip-chip bonding, the solder 53 reliably flows along the side surfaces of the terminals 62 or 63 over the entire areas thereof. As a result, the connection areas between the solder 53 and the power supply terminals 62 or between the solder 53 and the ground terminals 63 are increased, and the efficiency of power supply to the IC chip 51 connected to the circuit board 10 by flip-chip bonding can be reliably increased. In addition, since the reinforcing portions 64 are provided, the area of exposed portions of the signal terminals 61 in the second openings 42 is relatively small. Therefore, even when the signal terminals 61 are arranged at a small pitch, the risk of short-circuiting between the signal terminals 61 can be reduced.

The embodiment of the present invention may be modified as follows.

In the embodiment, the reinforcing portions 64 are provided in the second openings 42, but are not provided in the first openings 41. Therefore, the inner bottom surfaces S1 of the first openings 41 are defined by the surface of the resin insulating layer 22 on the inner side of the solder resist layer 23. In addition, surfaces of the power supply terminals 62 or the ground terminals 63, which are disposed in the first openings 41, other than the lower surfaces (that is, the entire upper and side surfaces) are exposed. However, the structure of an organic circuit board 10A according to another embodiment illustrated in FIG. 15, for example, may instead be employed. In the organic circuit board 10A, portions of the solder resist layer 23 remain in the first openings 41 as the resin portions 68. Accordingly, the inner bottom surfaces S1 of the first openings 41 are defined by the surface of the solder resist layer 23. Similar to the above-described embodiment, the projection height h1 of the power supply terminals 62 or the ground terminals 63 in the first openings 41 is greater than the projection height h2 of the signal terminals 61 in the second openings 42.

Figure 15:
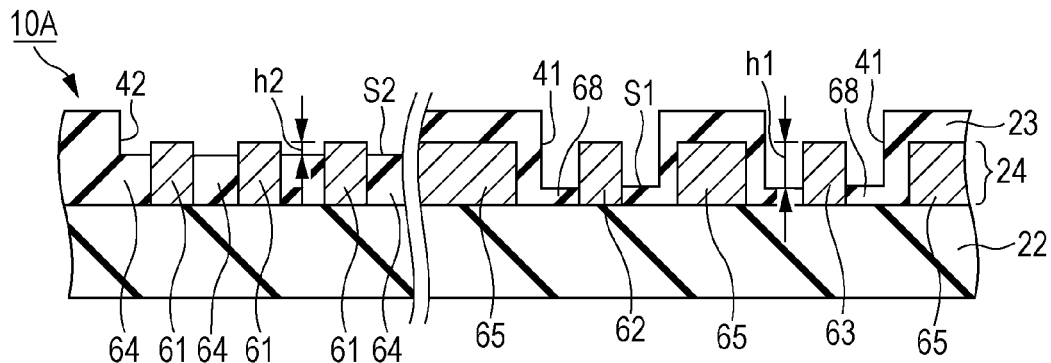
FIG. 15 is an enlarged sectional view of a main portion of an organic circuit board according to another embodiment.
Figure 16:
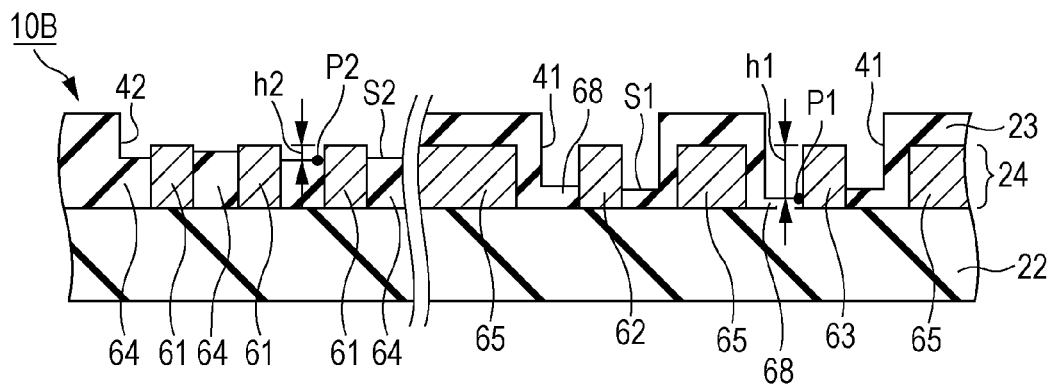
FIG. 16 is an enlarged sectional view of a main portion of an organic circuit board according to another embodiment.

In the embodiment illustrated in FIG. 15, the reinforcing portions 64 in the second openings 42 and the resin portions 68 in the first openings 41 have uniform thicknesses. However, the structure of an organic circuit board 10B according to another embodiment illustrated in FIG. 16, for example, may instead be employed. In the organic circuit board 10B, the reinforcing portions 64 have slightly different thicknesses, and the inner bottom surfaces S2 are at different heights. In FIG. 16, the inner bottom surface S2 denoted by P2 is at the innermost position, and the height thereof is defined as a reference projection height h2. The resin portions 68 also have slightly different thicknesses, and the inner bottom surfaces S1 are at different heights. In FIG. 16, the inner bottom surface S1 denoted by P1 is at the innermost position, and the height thereof is defined as a reference projection height h1.

Figure 17:
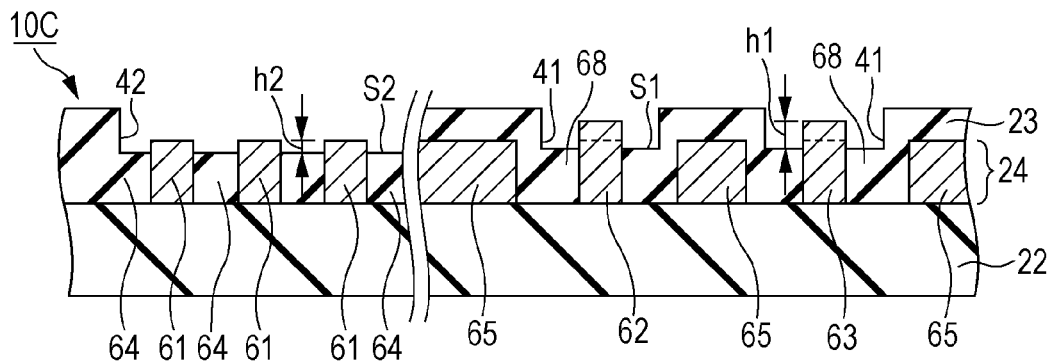
FIG. 17 is an enlarged sectional view of a main portion of an organic circuit board according to another embodiment.

In the above-described embodiment, the height of the power supply terminals 62 or the ground terminals 63 disposed in the first openings 41 is the same as the height of the signal terminals 61 disposed in the second openings 42. However, as in an organic circuit board 10C according to another embodiment illustrated in FIG. 17, the height of the power supply terminals 62 and the ground terminals 63 disposed in the first openings 41 may be greater than that of the signal terminals 61 disposed in the second openings 42. In the organic circuit board 10C, the power supply terminals 62 and the ground terminals 63 are plated with copper to increase the height thereof. However, the power supply terminals 62 and the ground terminals 63 are formed such that the upper surfaces thereof are below the opening edges of the first openings 41.

In the above-described embodiment, the solder resist layer 23 including the reinforcing portions 64 is formed by applying the photosensitive resin insulating material to the surface of the resin insulating layer 22 and then performing partial exposure and development twice. However, the method for forming the solder resist layer 23 as the outermost resin insulating layer may be changed as appropriate. For example, a thermosetting resin insulating material may be applied to the surface of the resin insulating layer 22 and cured, and then be mechanically ground until the surfaces of the terminals 61 to 63 are exposed. In this case, abrasive machining, such as sandblasting, or a dry etching process may be performed instead of the mechanical grinding process. Alternatively, a direct exposure method may be carried out by using a laser exposure device.

In the organic circuit board 10 according to the above-described embodiment, all of the terminals exposed in the second openings 42 are the signal terminals 61. However, the exposed terminals are not limited to this. For example, the terminals exposed in the second openings 42 may include terminals other than the signal terminals 61 (for example, the power supply terminals 62 or the ground terminals 63).

The organic circuit board 10 according to the above-described embodiment includes the core substrate 13. However, the present invention is not limited to this, and may also be applied to a coreless circuit board which does not include a core substrate.

The organic circuit board 10 according to the above-described embodiment has a ball grid array (BGA) structure. However, the present invention is not limited to this, and may also be applied to circuit boards having a pin grid array (PGA) structure or a land grid array (LGA) structure.

Technical ideas based on the above-described embodiments other than the technical ideas described in the claims will be listed.

(1) The circuit board in which the second opening is disposed in an outer peripheral area of the electronic-component mounting region and the first opening is disposed in a central area of the electronic-component mounting region.

(2) The circuit board in which the first opening is surrounded by a large-area conductor portion that is connected to the power supply terminal or the ground terminal.

(3) The circuit board in which the terminal exposed in the first opening has a NSMD structure.

(4) The circuit board in which the opening area of the first opening is smaller than that of the second opening.

(5) The circuit board in which the multilayer body is a build-up multilayer wiring body.

(6) The circuit board in which the distance between the terminals disposed in two adjacent first openings is greater than the distance between two adjacent terminals disposed in the second opening.

(7) The circuit board in which the height of the terminal disposed in the first opening is substantially equal to the height of the terminals disposed in the second opening.

(8) The circuit board in which the height of the terminal disposed in the first opening is greater than the height of the terminals disposed in the second opening and smaller than the height of the opening edge of the first opening.

What is claimed is:

1. A circuit board comprising:
    a multilayer body including a plurality of resin insulating layers and a plurality of conductor layers that are alternately stacked,
    wherein an outermost conductor layer of the plurality of conductor layers includes a plurality of terminals for connecting an electronic component to the circuit board by flip-chip bonding,
    wherein an outermost resin insulating layer of the plurality of resin insulating layers, at which the terminals are exposed, has an inner side adjacent to another one of the plurality of resin insulating layers, the outermost resin insulating layer defining a first opening exposing a first bottom surface and a second opening exposing a second bottom surface,
    wherein the terminals include a power supply terminal, a ground terminal, and a signal terminal,
    wherein the first opening of the outermost resin insulating layer also exposes a single terminal selected from the power supply terminal and the ground terminal, the terminal exposed by the first opening having a portion projecting from the first bottom surface,
    wherein the second opening of the outermost resin insulating layer also exposes two or more of the terminals including at least the signal terminal,
    wherein the outermost resin insulating layer further includes a reinforcing portion that defines the second bottom surface, the reinforcing portion having a height smaller than or equal to a height of the terminals exposed by the second opening and covering side surfaces of the terminals exposed by the second opening,
    wherein a surface of the outermost resin insulating layer or a surface of the another one of the resin insulating layers that is on the inner side of the outermost resin insulating layer defines the first bottom surface, and
    wherein a height of the portion of the terminal exposed by the first opening is greater than a difference between the height of the terminals exposed by the second opening and the height of the reinforcing portion.

2. The circuit board according to claim 1, wherein the terminal exposed by the first opening includes a lower surface that is in contact with the another one of the resin insulating layers on the inner side of the outermost resin insulating layer, and wherein all surfaces of the terminal exposed by the first opening other than the lower surface are exposed by the first opening.

* * * * *